United States Patent [19]

Colles

[11] Patent Number: 4,794,282
[45] Date of Patent: Dec. 27, 1988

[54] TTL TO CMOS VOLTAGE LEVEL TRANSLATOR

[75] Inventor: Joseph H. Colles, Oceanside, Calif.

[73] Assignee: Brooktree Corporation, San Diego, Calif.

[21] Appl. No.: 106,179

[22] Filed: Oct. 7, 1987

Related U.S. Application Data

[63] Continuation of Ser. No. 714,503, Mar. 21, 1985, abandoned.

[51] Int. Cl.⁴ .................. H03K 19/092; H03K 17/687; H03L 5/00
[52] U.S. Cl. ..................................... 307/475; 307/264; 307/451; 307/519; 307/585
[58] Field of Search ............... 307/451, 496, 362, 579, 307/585, 475, 264

[56] References Cited

FOREIGN PATENT DOCUMENTS 0220617 11/1985 Japan .................................. 307/475

Primary Examiner—John Zazworsky
Assistant Examiner—M. R. Wanbach
Attorney, Agent, or Firm—Ellsworth R. Roston; Charles H. Schwartz

[57] ABSTRACT

A digital value represented by first and second pluralities of signals is converted into an analog value represented by an analog signal. The converter and the associated circuitry described above are preferably disposed on an integrated circuit chip formed from C-MOS transistors. Circuitry is also provided for converting signal levels from TTL logic devices external to the chip into signals for operating the C-MOS transistors on the chip by adjusting the voltages from the TTL logic devices into voltages optimal for operating the C-MOS transistors. The circuits of this invention are advantageous because they operate satisfactorily at frequencies in excess of eighty-five megahertz (85 mhz).

25 Claims, 4 Drawing Sheets

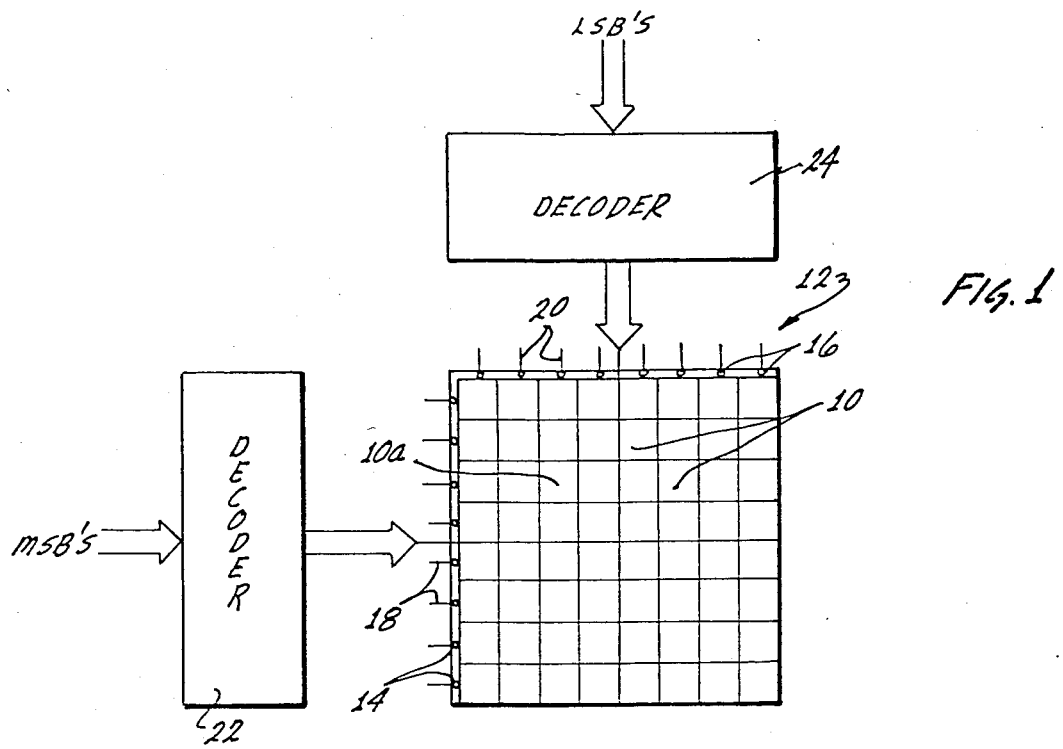
FIG. 1
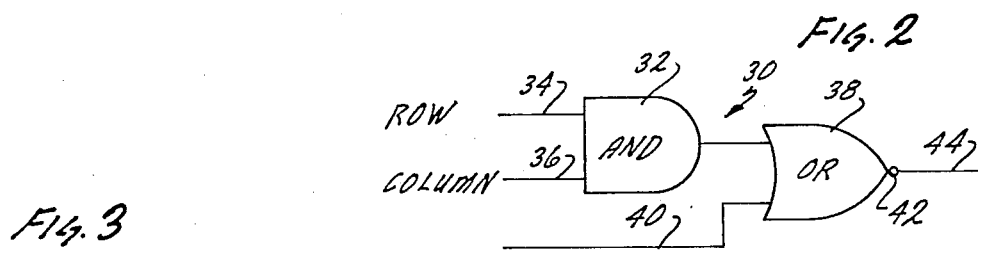
FIG. 2
FIG. 3
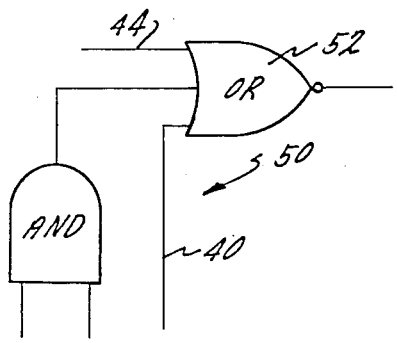
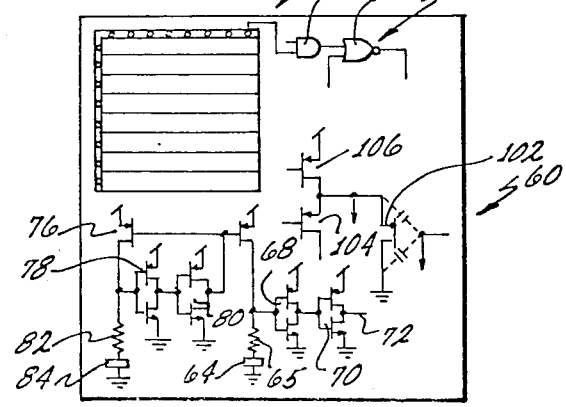
FIG. 4

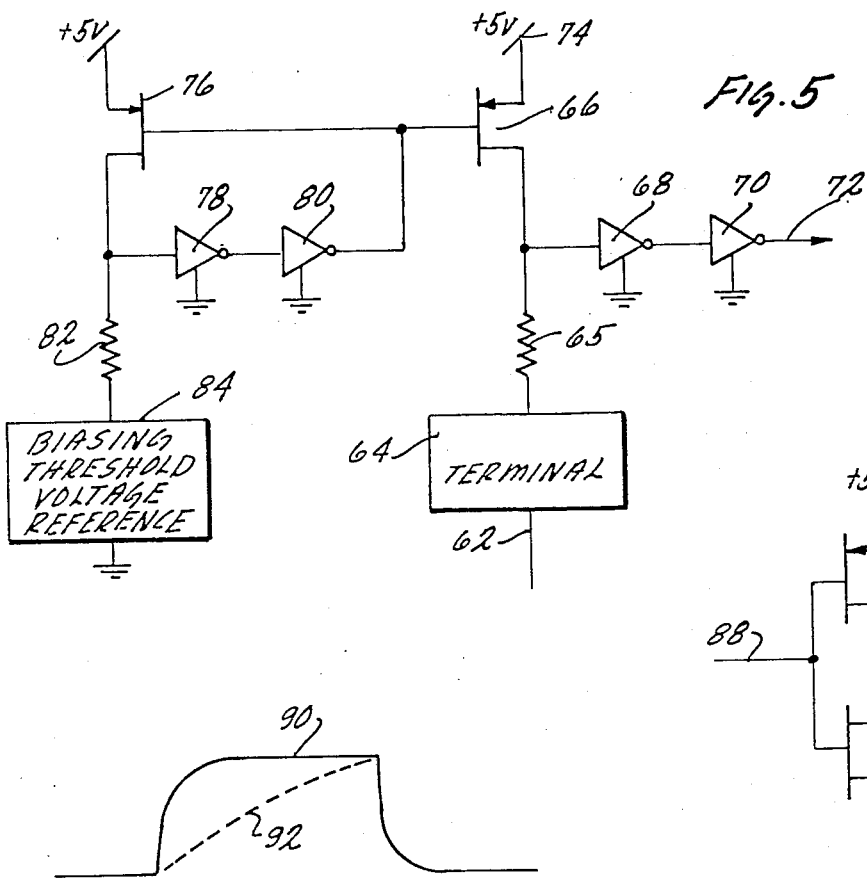
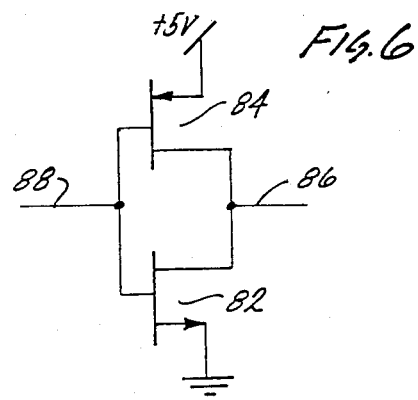
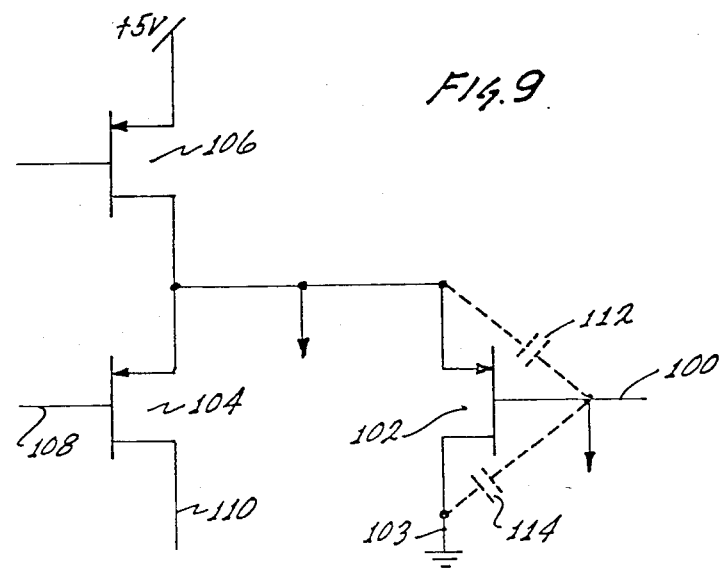

TTL TO CMOS VOLTAGE LEVEL TRANSLATOR

This is a continuation of application Ser. No. 714,503, filed Mar. 21, 1985, abandoned.

This invention relates to systems for converting between digital and analog values. The system is particularly advantageous because it is constructed to operate on a monotonic basis in a simple and straightforward manner to provide accurate indications of analog values. The system is also advantageous because it is able to operate at high speeds to provide such analog indications.

Various types of equipment receive information in analog form. Such equipment includes process control equipment, measuring instruments, communication equipment and a wide variety of other equipments. Digital computers and data processing systems often receive input parameters in analog form from such equipment and convert these analog parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

The converter and associated circuitry of this invention are preferably disposed on an integrated circuit chip which includes C-MOS transistors. Circuitry is provided on the chip for converting signals from TTL logic devices external to the chip into signals for operating the C-MOS transistors on the chip by adjusting the variable output voltages from the TTL logic devices into input voltages optimal for operating the C-MOS transistors on the chips. Such circuitry provides output currents of optimal wave forms to operate the C-MOS transistors on the chip. Such circuitry is advantageous because it is able to operate satisfactorily at frequencies in excess of eighty-five megahertz (85 mhz) in contrast to maximum frequencies of approximately twenty-five megahertz (25 mhz) for comparable circuitry in the prior art. The circuitry provides such conversions from the TTL logic devices to C-MOS circuitry with only a single power supply rather than two (2) power supplies as in the prior art.

In the drawings:

FIG. 1 illustrates circuitry included on a chip for converting output voltages from TTL logic devices external to the chip into input voltages for energizing C-MOS transistors disposed on the chip;

FIG. 2 illustrates the electrical construction of inverters included in the circuitry shown in FIG. 1;

FIG. 3 illustrates waveforms of voltages produced in the circuitry shown in FIGS. 1 and 2; and FIG. 4 illustrates waveforms of input voltages to the circuitry shown in FIG. 7 and output voltages from such circuitry.

Figure 8:
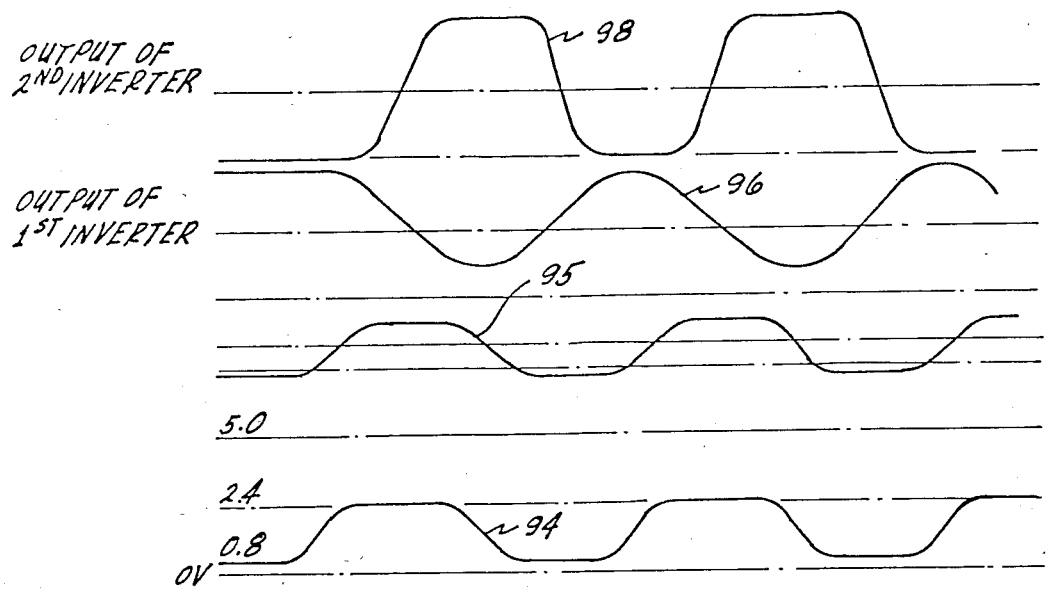
Figure 10:
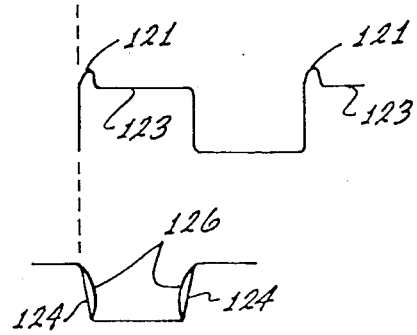
Figure 11:
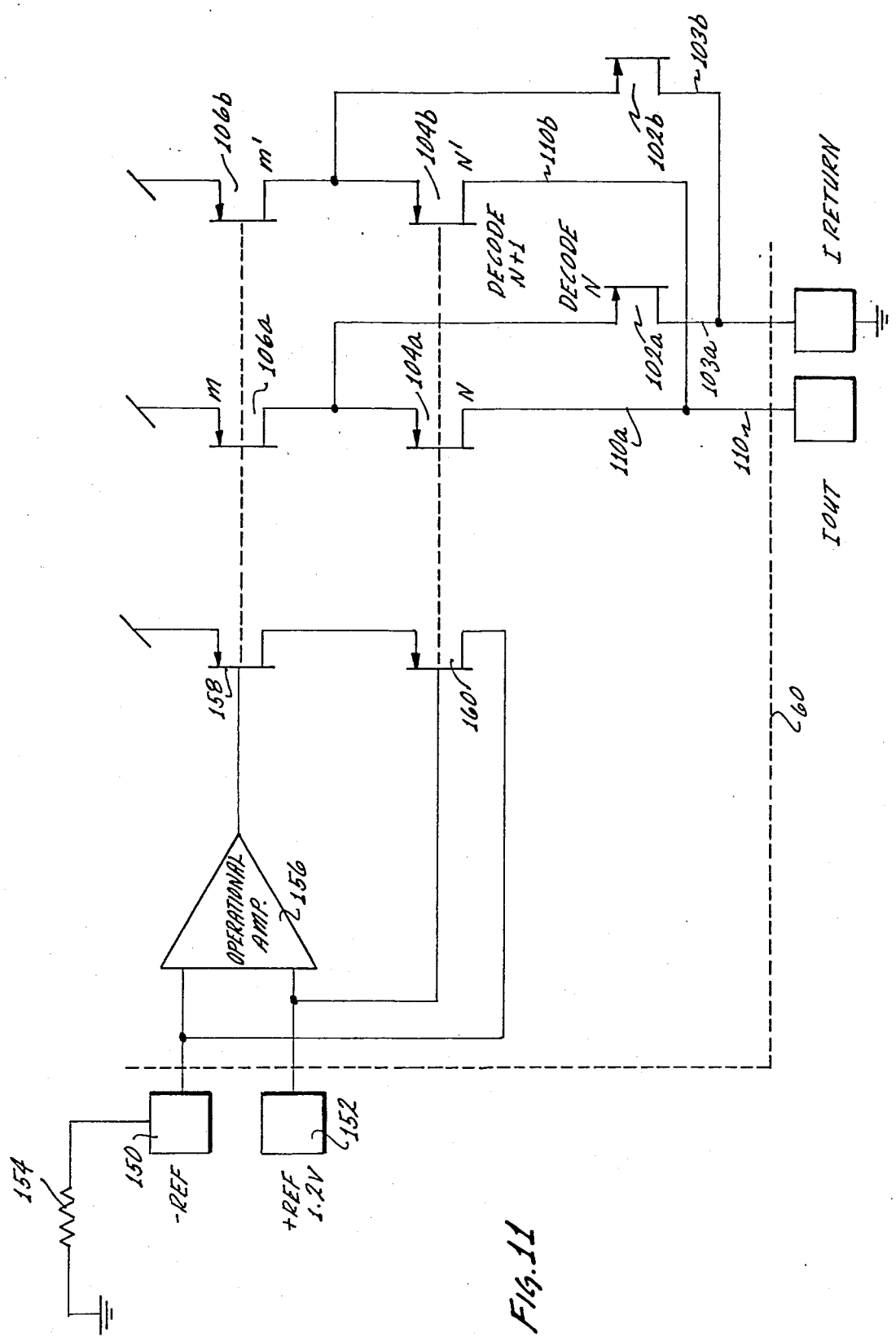

The C-MOS transistors on a chip preferably operate with input voltages of approximately 0 volts to approximately 5 volts with a logic threshold of approximately 2.5 volts. It has previously been difficult to convert the output voltages from TTL logic devices to the proper input voltages for C-MOS transistors when it has been desired to operate digital-to-analog converters at high frequencies in excess of approximately twenty-five megahertz (25 mhz).

This invention provides circuitry for converting the output voltages from the TTL logic devices to the proper input voltages to the C-MOS transistors, even with considerable variations in supply voltage temperature and C-MOS process parameters. The circuitry of this invention provides such a conversion at frequencies in excess of eighty-five megahertz (85 mhz) with 3 micron gate length C-MOS technology. This frequency is well in excess of frequencies of approximately twenty-five megahertz (25 mhz), the maximum frequency capable of being provided by comparable circuitry now in use.

The circuitry of this invention uses only one power supply in converting from TTL logic devices to C-MOS transistors at high frequencies in excess of twenty-five megahertz (25 mhz). This is in contrast to digital-to-analog converters constructed from bipolar circuitry since, although bipolar circuits are relatively fast, they generally require two (2) power supplies, one providing a positive voltage and the other providing a negative voltage.

The circuitry of this invention for converting from TTL logic devices to C-MOS circuitry is shown in FIG. 1 for each digital signal input to integrated circuit chip 60 in FIG. 4. The circuitry shown in FIG. 1 includes a line 62 connected to the output of the external TTL logic device and to an input terminal 64 on the integrated circuit chip. A resistor 65 having a suitable value such as approximately 2,000 ohms is connected between the input 64 and the drain of a transistor 66 such as a C-MOS transistor of the p-type. A pair of inverters 68 and 70 are also connected to the drain of the transistor 66 and a line 72 is connected to the output of the inverter 70. The source of the transistor 66 receives an energizing voltage as at 74. This energizing voltage may be approximately +5 volts.

The gate of the transistor 66 has a common connection with the gate of a transistor 76 which may be a C-MOS transistor of the p-type. The characteristics of the transistor 76 and will preferably match the characteristics of the transistor 66 by virtue of being close on the integrated circuit chip to the transistor 66. The source of the transistor 76 has the same energizing voltage (+5 V.) applied to it as to the source of the transistor 66. A pair of inverters 78 and 80 are disposed electrically in series between the drain of the transistor 76 and the gates of the transistors 66 and 76.

A resistor 81 and a biasing threshold voltage reference 83 are in series between the drain of the transistor 76 and a reference potential such as ground. The resistor 81 may have a suitable value such as approximately two thousand (2000) ohms and in general matches the impedance of the resistor 65. The biasing network 83 provides the logic threshold voltage such as 1.4 volts. In the preferred embodiment, the resistor 81 and the reference voltage 83 are the equivalent of a resistance divider between the power supply and the reference potential such as ground.

The inverters 68 and 70 may be constructed in a manner substantially identical to the inverters 78 and 80. As shown in FIG. 2, each of the inverters 68, 70, 78 and 80 may be constructed from a pair of C-MOS transistors such as a C-MOS transistor 82 of the n-type and a C-MOS transistor 84 of the p-type. The drains of the transistors 82 and 84 have a common connection with an output line 86. The source of the transistor 82 is connected to a reference potential such as ground and the source of the transistor 84 is provided with the same energizing potential as the sources of the transistors 74 and 76. The gates of the transistors 82 and 84 have a common connection with an input line 88.

The area occupied by the transistor 84 on the chip 60 in FIG. 2 is preferably greater by a suitable factor such as a factor of approximately three (3) than the area occupied by the transistor 82. This difference in area causes the transconductance of the transistors 82 and 84 to become matched. Typically the difference in the areas occupied by the transistors 82 and 84 on the chip 60 results from a difference in the width of the transistors on the chip. If the transistors 82 and 84 are not provided with different areas, the transconductance of the transistor 82 will be approximately three (3) times greater than the transconductance of the transistor 84.

The circuitry shown in FIG. 1 operates to regulate the input voltage applied to the inverter 78 such that this input voltage is at the C-MOS logic threshold of about 2.5 volts. The transistor 76 in such circuitry is generally conductive. Current from the transistor 76 through the resistor 81 causes a level shift voltage to be produced across the resistor 81. This voltage is the difference between the C-MOS threshold determined by the inverter 78 and the voltage provided by the threshold voltage reference 83. For operation as a logic translator between TTL (logic device and a C-MOS transistor) the threshold voltage reference is set to the TTL logic threshold of 1.4 volts.

If the threshold of the inverter 68 matches the threshold of the inverter 78 and if the impedances of the transistors 66 and 76 match and the impedances of the resistors 81 and 65 match, the transistor 66 will induce the same voltage across the resistor 65 as the transducer 76 induces across the resistor 81. Thus, when the input 62 is at the TTL threshold of approximately 1.4 volts, the inverter 68 will be at the C-MOS threshold of approximately 2.5 volts.

The high speed operation of the signal carrying inverters 68 and 78 shown in FIG. 1 is facilitated by the balanced arrangement of such circuitry. Since the inverters 68 and 70 have C-MOS thresholds, the transconductances in the transistors 82 and 84 (FIG. 6) for each inverter are matched with each other. By providing such a balanced relationship in the circuitry shown in FIGS. 1 and 2, a signal such as illustrated at 90 in FIG. 3 is produced on the line 72 when an input signal representing a change between a binary "1" and a binary "0" is provided on the line 62. This signal has a relatively fast response, particularly on its leading edge, in comparison to a signal, such as that illustrated at 92 in FIG. 3, which is produced by the circuitry of the prior art. This is because, in the prior art, the threshold is changed between a C-MOS transistor (i.e. approximately 2.5 V) to a TTL logic device (i.e. approximately 1.4 V) by reducing the transconductance of a transistor corresponding to the transistor 84 relative to that of a transistor corresponding to the transistor 82.

The advantages of providing pairs of inverters such as the inverters 78 and 80 and the inverters 68 and 70 may be seen from the waveforms shown in FIG. 4. A waveform 94 in FIG. 4 illustrates the input to the terminal 64 from the TTL logic device. A waveform 95 in FIG. 4 illustrates the input to the C-Mos transistor 66. A waveform 96 in FIG. 4 illustrates the signal produced by the inverter 68 in FIG. 1 and a waveform 98 in FIG. 4 illustrates the signal produced by the inverter 70 in FIG. 1. As will be seen, the signal 98 is squared relative to the signal 96. This results from the saturation of the signal from the inverter 68 by the increased amplitude provided by the inverter 70 in FIG. 1.

The circuitry shown in FIGS. 1 and 2 and described above has certain important advantages. It provides a simple and reliable conversion from the output voltages from the TTL logic devices to the input voltages to the C-MOS circuitry so that the digital-to-analog converter can be provided in C-Mos logic on an integrated circuit chip. In providing this conversion from the output voltages from the TTL logic devices to the input voltages to the C-MOS circuitry, the ciruitry shown in FIGS. 1 and 2 and described above changes voltages between approximately 0.4 volts and 2.4 volts in the TTL logic devices (in representation of binary 1's and binary 0's) to voltages between approximately 1.5 and 3.5 volts as required by the C-MOS circuitry (in representation of binary 1's and binary 0's). The circuitry shown in FIGS. 1 and 2 provides such voltage conversions at frequencies in excess of eighty-five megahertz (85 mhz). The circuitry shown in FIGS. 1 and 2 provides such voltage conversions with only a single power supply providing approximately 5 volts.

The circuitry shown in FIGS. 1 and 2 also has other advantages of some importance. For example, if the inverter 78 is biased to become non-conductive and then transistor 76 is made non-conductive, signals may be introduced to the line 62 for passage to the inverter 68 with no level shift. Under such circumstances, the input circuit threshold on the line 72 is compatible with C-MOS logic external to the integrated circuit chip.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for converting an output voltage from a TTL logic device to an input voltage for C-MOS circuitry, first means for providing the output voltage from the TTL logic device, a first C-MOS transistor having first, second and third electrodes, means for applying an energizing voltage to the first electrode of the first C-MOS transistor to provide for the flow of current through the first C-MOS transistor, a first biasing impedance connected between the second electrode of the first C-MOS transistor and the first means, a second C-MOS transistor having first, second and third electrodes respectively corresponding to the first, second and third electrodes of the first C-MOS transistor, means for applying the energizing voltage to the first electrode of the second C-MOS transistor to provide for the flow of current through the second C-MOS transistor, a second biasing impedance connected to the second electrode of the second C-MOS transistor, means for biasing the second electrode of the second C-MOS transistor through the second biasing impedance to a voltage related to the input voltage to the C-MOS circuitry, means for providing a negative feedback between the second and third electrodes of the second C-MOS transistor, and means for introducing the voltage on the third electrode of the second C-MOS transistor to the third electrode of the first C-MOS transistor.

2. In combination as set forth in claim 1,
the first and second biasing impedances constituting resistances of substantially equal value.

3. In a combination as set forth in claim 1,
the negative feedback means including a pair of C-MOS inverters, and
inverter means connected to the second electrode of the first C-MOS transistor and having characteristics corresponding to the characteristics of the pair of C-MOS inverters in the negative feedback means.

4. A combination as set forth in claim 3,
the first and second biasing means constituting resistors of substantially equal values, and
the first and second transistors having substantially identical characteristics.

5. In combination for converting an output voltage from a TTL logic device to an input voltage for C-MOS circuitry,
a first C-MOS transistor having first, second and third electrodes,
first biasing means,
means for introducing the output voltage from the TTL logic device through the first biasing means to the first electrode of the first C-MOS transistor,
means for introducing an energizing voltage to the second electrode of the first C-MOS transistor,
means for obtaining the input voltage from the TTL logic device for the C-MOS circuitry from the first electrode of the first C-MOS transistor,
a second C-MOS transistor having first, second and third electrodes,
second biasing means for biasing the first electrode of the second C-MOS transistor to a voltage related to the input voltage to the C-MOS circuitry,
inverter means connected between the first and third electrodes of the second C-MOS transistor and cooperating with the second C-MOS transistor to provide a negative feedback voltage from the first electrode of the second C-MOS transistor to the third electrode of the second C-MOS transistor, and
means for introducing the voltage on the third electrode of the second C-MOS transistor to the third electrode of the first C-MOS transistor.

6. A combination as set forth in claim 5 wherein
the first, second and third electrodes of each of the first and second C-MOS transistors respectively constitute the drain, source and gate of such transistor, and
means for introducing an energizing voltage to the source of the second C-MOS transistor.

7. A combination as set forth in claim 5 wherein
each of the first and second biasing means constitutes a resistor and the resistors constituting the first and second biasing means have substantially the same values.

8. A combination as set forth in claim 7 wherein
each of the inverter means includes a pair of C-MOS transistors, one of the transistors in each pair constituting a p-type transistor and the other transistor in each pair constituting an n-type transistor.

9. A combination as set forth in claim 8 wherein
the transistors in each of the inverter means are disposed on a chip and the p-type transistor in each inverter means has an area approximately five (5) times greater than the n-type transistor in each inverter means.

10. In combination for converting an output voltage of a first voltage level from a TTL logic device to an input voltage of a second voltage level, different from the first voltage level, for C-MOS circuitry,
a C-MOS transistor having a source, a gate and a drain,
means for introducing the output voltage of the first voltage level from the TTL logic device to the drain of the C-MOS transistor,
means for introducing an energizing voltage to the source of the C-MOS transistor,
impedance means providing a particular impedance and connected between the drain of the C-MOS transistor and the means for providing the TTL voltage,
regulating means for producing a voltage of the second voltage level, such means including a second impedance equal to the impedance from the impedance means,
means for introducing the voltage of the second voltage level to the gate of the C-MOS transistor, and
means for introducing the input voltage to the C-MOS circuitry from the drain of the C-MOS transistor.

11. In a combination as set forth in claim 10,
means connected to the regulating means for providing an impedance equal to the particular impedance.

12. In a combination as set forth in claim 11,
inverter means connected between the drain of the C-MOS transistor and the input voltage means to the C-MOS circuitry.

13. In combination as set forth in claim 11,
the regulating means including means for biasing the regulating means with a voltage related to the output voltage from the TTL logic device.

14. In a combination as set forth in claim 13,
the regulating means including a second C-MOS transistor having a source, a gate and a drain,
means for introducing the energizing voltage to the source of the second C-MOS transistor,
means for introducing the biasing voltage through the second impedance means to the drain of the second C-MOS transistor,
means for providing a negative feedback voltage between the drain of the second C-MOS transistor and the gate of the second C-MOS transistor, and
means for introducing the voltage on the gate of the second C-MOS transistor to the gate of the first C-MOS transistor.

15. In a combination as set forth in claim 10,
the C-MOS transistor constituting a p-type.

16. In a combination as set forth in claim 14,
the first and second C-MOS transistors constituting p-types.

17. A combination as set forth in claim 9, including,
inverter means connected to the first electrode of the first C-MOS transistor and having characteristics corresponding to the characteristics of the inverter means connected between the first and second electrodes of the second C-MOS transistor.

18. A combination as set forth in claim 17 wherein each of the first and second biasing means constitutes a resistor and the resistors constituting the first and second binary means have substantially the same values.

19. In a combination as set forth in claim 10,
a pair of inverter means connected to the drain of the C-MOS transistor, and
an output line connected to the pair of inverter means to provide the input voltage to the C-MOS circuitry.

20. In a combination as set forth in claim 14,
a first pair of inverters connected between the drain of the second C-MOS transistor and the gates of the first and second C-MOS transistors,
a second pair of inverters connected to the drain of the first C-MOS trasistor,
the first and second pairs of inverters having substantially identical characteristics, and
a line connected to the second pair of inverters to provide the input voltage for the C-MOS circuitry.

21. In a combination as set forth in claim 20,
each of the inverters in the first and second pairs including third and fourth C-MOS transistors, the third and fourth C-MOS transistors in each of the inverters in the first and second pairs respectively being p-type and n-type,
the gates of the third and fourth C-MOS transistors in each inverter receiving the input voltage to the inverter, the source of the third C-MOS transistor receiving the energizing voltage and the source of the fourth C-MOS transistor in each inverter receiving a reference potential such as ground and the drains of the third and fourth C-MOS transistors in each inverter providing the output voltage from the inverter.

22. In a combination as set forth in claim 8, wherein
the gates of the transistors in each inverter means receive the input voltage to the inverter means and the drains of the transistors in each inverter means provide the output voltage from the inverter means.

23. In a combination as set forth in claim 22,
the source of the n-transistor in each inverter means receiving a reference potential such as ground and the source of the p-transistor in each inverter means receiving the energizing voltage.

24. In a combination as set forth in claim 21,
the transistors in each inverter means having matched characteristics.

25. In a combination as set forth in claim 23,
the transistors in each inverter means having matched characteristics.

* * * * *